United States Patent
Ansari et al.

(10) Patent No.: US 12,498,616 B2
(45) Date of Patent: *Dec. 16, 2025

(54) PIEZOELECTRIC RESONANT-BASED MECHANICAL FREQUENCY COMBS

(71) Applicant: Georgia Tech Research Corporation, Atlanta, GA (US)

(72) Inventors: Azadeh Ansari, Atlanta, GA (US); Mingyo Park, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/201,330

(22) Filed: May 7, 2025

(65) Prior Publication Data
US 2025/0264773 A1    Aug. 21, 2025

Related U.S. Application Data

(63) Continuation of application No. 18/498,963, filed on Oct. 31, 2023, now Pat. No. 12,321,079, which is a continuation of application No. 17/053,528, filed as application No. PCT/US2019/031504 on May 9, 2019, now Pat. No. 11,835,843.

(60) Provisional application No. 62/669,143, filed on May 9, 2018.

(51) Int. Cl.
*G02F 1/35* (2006.01)
*H03H 9/02* (2006.01)
*H03H 9/17* (2006.01)

(52) U.S. Cl.
CPC ............ *G02F 1/353* (2013.01); *H03H 9/173* (2013.01); *H03H 9/174* (2013.01); *G02F 2203/56* (2013.01); *H03H 9/02015* (2013.01)

(58) Field of Classification Search
CPC ........ G02F 1/353; H03H 9/173; H03H 9/174; H03H 9/02015
See application file for complete search history.

(56) References Cited

U.S. PATENT DOCUMENTS

| | | |
|---|---|---|
| 6,492,759 B1 | 12/2002 | Watanabe |
| 9,268,092 B1 | 2/2016 | Jarecki, Jr. et al. |
| 9,450,563 B2 | 9/2016 | Gorisse et al. |
| 11,567,147 B1 | 1/2023 | Kubena et al. |
| 11,581,871 B1 | 2/2023 | Mohanty |

(Continued)

OTHER PUBLICATIONS

International Search Report for PCT/US2019/031504 mailed Jul. 23, 2019.

(Continued)

*Primary Examiner* — Samuel S Outten
(74) *Attorney, Agent, or Firm* — Thomas | Horstemeyer, LLP

(57) ABSTRACT

The present disclosure describes systems and methods for novel phononic frequency combs and related sensing techniques realized by a piezoelectric multimode or single-mode mechanical resonator based on parametric pumping. In one embodiment, a method comprises driving a piezoelectric mechanical resonator with an electrical AC signal, wherein the electrical AC signal causes motion of the piezoelectric mechanical resonator; and producing at least one phononic frequency comb in response to the motion of the piezoelectric mechanical resonator.

20 Claims, 18 Drawing Sheets

(56) References Cited

U.S. PATENT DOCUMENTS 11,835,843 B2 * 12/2023 Ansari ............... H03H 9/02078
12,321,079 B2 * 6/2025 Ansari ................... G02F 1/353

OTHER PUBLICATIONS

Ganesan, A. et al. "Phononic frequency comb via intrinsic three-wave mising", Physical Review Letters, vol. 118, No. 3; Jan. 17, 2017.

* cited by examiner

PIEZOELECTRIC RESONANT-BASED MECHANICAL FREQUENCY COMBS

CROSS-REFERENCE TO RELATED APPLICATION

This application is a continuation of U.S. application Ser. No. 18/498,963, entitled "Piezoelectric Resonant-Based Mechanical Frequency Combs," filed Oct. 31, 2023, which is a continuation of U.S. application Ser. No. 17/053,528, entitled "Piezoelectric Resonant-Based Mechanical Frequency Combs," filed Nov. 6, 2020, which is a 35 U.S.C. § 371 national stage application of PCT Application No. PCT/US19/31504, filed May 9, 2019, which claims priority to U.S. provisional application entitled, "Piezoelectric Resonant-Based Micromechanical Frequency Combs," having Ser. No. 62/669,143, filed May 9, 2018, all of which are entirely incorporated herein by reference.

TECHNICAL FIELD

The present disclosure is generally related to micromechanical frequency combs.

BACKGROUND

Frequency combs have been used in frequency synthesizers, precision time metrology, and molecular spectroscopy as well as wavelength multiplexing. While optical frequency combs haven been widely used previously, their micromechanical counterparts have only been recently demonstrated by electrostatic coupling of two or more resonators or multiple input frequencies.

Other techniques for micromechanical frequency combs are contemplated in this disclosure that are new and novel, including tunable micromechanical frequency combs with electrical input and output, which operate based on a single electrical tone frequency with low input power.

SUMMARY

Embodiments of the present disclosure provide systems and methods for phononic frequency combs and related sensing techniques realized by a piezoelectric multimode or single-mode mechanical resonator based on parametric pumping. Briefly described, one embodiment of the system, among others, can be implemented as follows. A single frequency electrical input (pump) provides an electrical signal comprising an amplitude and a single input frequency to a multimode mechanical resonator. The mechanical resonator is configured to produce at least one phononic frequency comb in response to a motion of the mechanical resonator caused by the electrical signal. Accordingly, the mechanical resonator comprises a piezoelectric structure having two resonance modes within a single acoustic cavity of the mechanical resonator, coupled by thin film stress; and a value of the single input frequency equals a sum of the resonance frequencies of the two resonance modes of the mechanical resonator which is referred as non-degenerate parametric pumping.

Other embodiments having additional features are also disclosed. Such features include wherein three sets of frequency combs are achieved, wherein two sets are located proximal to the two resonance modes of the mechanical resonator and one set is located at the single input frequency, wherein each of the frequency combs have equally-distanced spectral lines; wherein a frequency spacing of the phononic frequency comb is selectively adjustable based on the electrical signal of the single frequency electrical input; wherein the frequency and the amplitude of the electrical signal are selective adjustable; wherein the mechanical resonator comprises a piezoelectric circular drumhead resonator; wherein the piezoelectric circular drumhead resonator comprises an AlN-on-Si circular membrane surrounded by a mesa structure; and wherein the resonance modes of the mechanical resonator are tunable by applying a DC voltage to a clamped boundary of the mechanical resonator, or by adjusting the amplitude and frequency, among other possible features. Possible applications for the disclosed phononic frequency comb systems include a self-sustained micromechanical sensor and a frequency synthesizer, among others.

The present disclosure also provides phononic frequency comb methods. In this regard, one embodiment of such a method, among others, can be broadly summarized by the following: coupling a multimode mechanical resonator with a single frequency electrical input; driving the mechanical resonator with an electrical signal generated by the pump device, the electrical signal having an amplitude and a single input frequency; producing at least one phononic frequency comb in response to a motion of the mechanical resonator caused by the electrical signal; and probing the mechanical resonator to output a signal comprising the at least one phononic frequency comb; wherein the mechanical resonator comprises a piezoelectric structure having two resonance modes within a single acoustic cavity of the mechanical resonator; and wherein a value of the single input frequency equals a sum of the resonance frequencies of two acoustic modes of the mechanical resonator.

Other embodiments having additional operations and features are also disclosed. Such operations and/or features may include wherein the at least one phononic frequency comb comprises three sets of frequency combs, wherein two sets are located proximal to the two resonance modes of the mechanical resonator and one set is located at the single input frequency, wherein each of the frequency combs has equally-distanced spectral lines; adjusting a frequency spacing of the phononic frequency comb based on the electrical signal of the single frequency electrical input device; wherein the frequency and the amplitude of the electrical signal are selective adjustable; wherein the mechanical resonator comprises a piezoelectric circular drumhead resonator; wherein the piezoelectric circular drumhead resonator comprises an AlN-on-Si circular membrane surrounded by a mesa structure; wherein a diameter of the circular drumhead resonator does not exceed 30 µm; tuning the resonance modes of the mechanical resonator by applying a DC voltage to a clamped boundary of the mechanical resonator; detecting perturbations in the environment utilizing the at least one phononic frequency comb; and/or synthesizing a range of frequencies based on the at least one phononic frequency comb.

Other systems, methods, features, and advantages of the present disclosure will be or become apparent to one with skill in the art upon examination of the following drawings and detailed description. It is intended that all such additional systems, methods, features, and advantages be included within this description.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

The present disclosure describes systems and methods for novel phononic frequency combs and related sensing techniques realized by a piezoelectric multimode mechanical resonator (e.g., micromechanical or nanomechanical piezoelectric resonator) based on parametric pumping. In one embodiment, an integrated, self-sustained, high-Quality (Q), resonant-based frequency comb sensor is used as a sensor to track the frequency spacing between spectral lines of the frequency comb in order to increase the sensor sensitivity and cancel out the environmental drift effects on the sensor responsivity.

While mechanical resonators, in the most general definition, are passive components which are integrated with an energy restoring element (e.g. an electronic amplifier) to sustain oscillation in a feedback-loop system, embodiments of the present disclosure utilize a single frequency electrical input (e.g., a single tone pump device such as an AC voltage source) with an input or pump frequency equal to the sum of the frequencies of two acoustic or mechanical resonance modes within the same mechanical resonator Other embodiments utilize a single frequency electrical input with an input frequency equal to twice the resonance mode of a single-mode mechanical resonator.

Figure 1A:
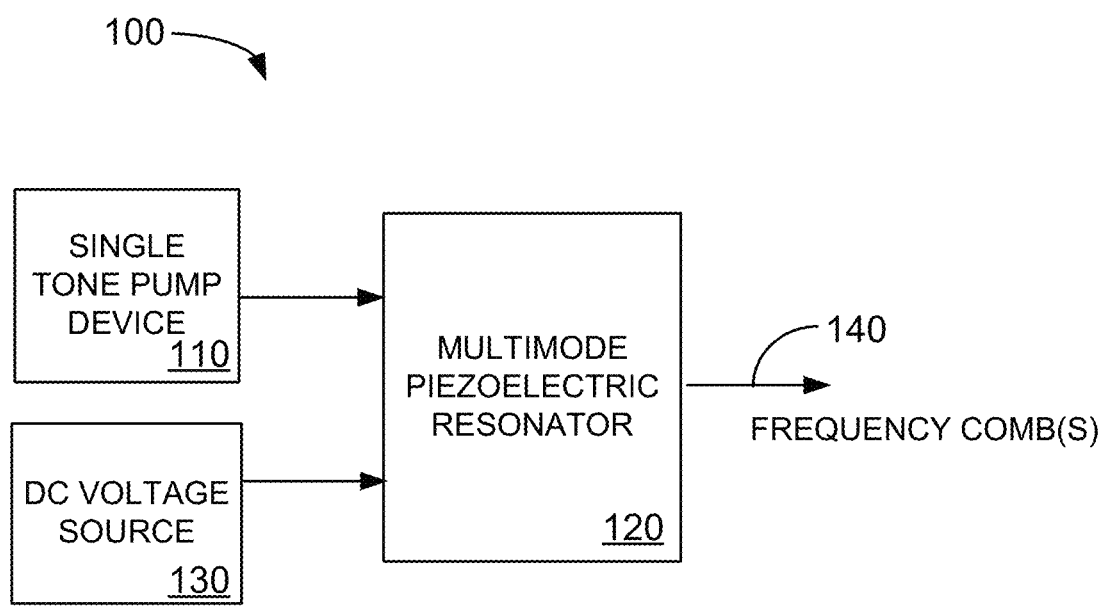
FIG. 1A is a block diagram of an exemplary phononic frequency comb system in accordance with various embodiments of the present disclosure.

Referring now to FIG. 1A, a block diagram of an exemplary phononic frequency comb system 100 of an embodiment of the present disclosure is depicted. In the figure, an electrical AC signal, from a single tone pump device 110 (also referred as a single frequency electrical input), drives a multimode piezoelectric mechanical resonator 120. The pump frequency (also referred as an input frequency) of the electrical signal is equal to the sum of the frequencies of two mechanical or acoustic modes of the mechanical resonator 120. Further, by applying a signal from a DC voltage source 130 coupled to the multimode mechanical resonator 120, the mechanical modes of the mechanical resonator 120 can be adjusted. The mechanical resonator 120 is configured to produce at least one phononic frequency comb at an output 140 in response to a motion of the mechanical resonator caused by the electrical signal.

In one embodiment, the mechanical resonator 120 comprises a piezoelectric structure having two resonance modes within a single acoustic cavity of the mechanical resonator. In one embodiment, a plurality of phononic frequency combs can be obtained by probing an output 150 of the mechanical resonator 120. For example, the output may include phononic frequency combs comprising three sets of frequency combs, wherein two sets are located proximal to the two resonant mechanical modes of the mechanical resonator and one set is located at the pump frequency, each of the frequency combs having equally-distanced phase-coherent spectral lines. In various embodiments, the frequency spacing of the phononic frequency comb(s) are selectively adjustable based on the electrical signal of the pump device 110.

The disclosed techniques offer several advantages over traditional MEMS-CMOS oscillator counterparts. First, they obviate the need for electronic circuitry (e.g., electronic amplifier) that suffers from shot noise overcoming the associated challenges with MEMS-CMOS integration, and thus improve the overall noise performance. Second, they offer a smaller footprint that takes advantage of piezoelectric-induced mode coupling between two (or more) resonance modes within the same acoustic cavity and a single tone pump 110.

Accordingly, the present disclosure provides embodiments for phononic frequency comb systems and methods based on efficient simultaneous excitation of two resonance modes using a single tone pump 110. To illustrate, an exemplary embodiment involves the generation and tuning of phononic frequency combs in a fully-integrated stand-alone piezoelectric platform. In practice, such frequency combs can be used for high-precision sensing that tracks frequency spacing between the phase-coherent spectral lines as the analogue of "beat frequency" in dual-mode oscillators.

For the single tone pump device 110, its pump frequency can be detuned from ($f_{m1}+f_{m2}$), where $f_{m1}$ and $f_{m2}$ are the two mechanical modes of the mechanical resonator, such that the pump frequency induces an idler and signal mode at frequencies close to $f_{m1}$ and $f_{m2}$. Frequency mixing between the idler (signal) mode and $f_{m1}$ ($f_{m2}$) may then create $\Delta f_1$ ($\Delta f_2$) that are proportional to the detuning of the pump 110 from $f_{m1}+f_{m2}$. Such a scheme can significantly reduce the electronics required for multipliers and mixers used in dual-mode oscillators to track "beat frequency."

In accordance with the present disclosure, any two mechanical modes can be chosen to generate frequency combs based on non-degenerate parametric pumping, in which the threshold power for comb generation can be reduced by designing high Q-resonance modes with high coupling rates. Furthermore, by utilizing two modes with different sensitivities, one can decrease the frequency shift through their linear combination.

Figure 1B:
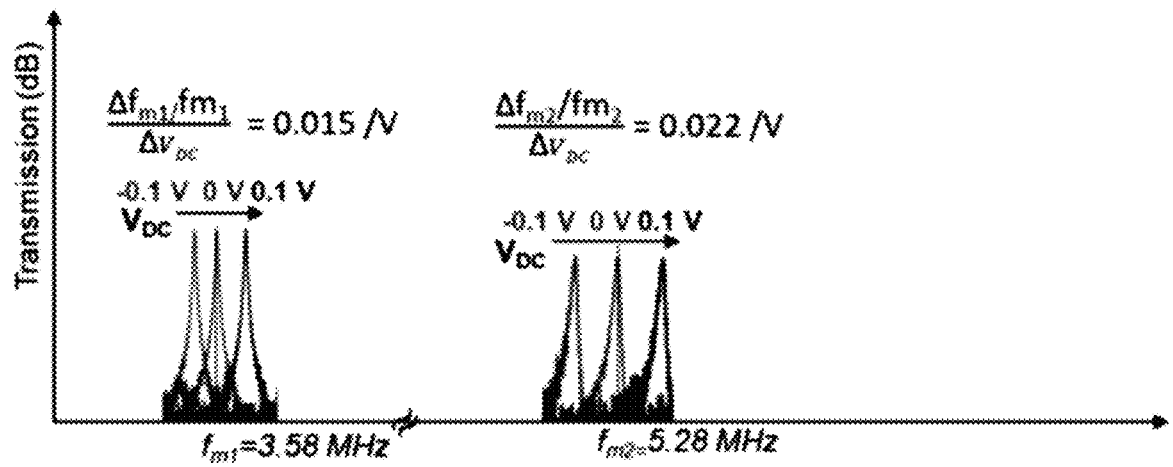
FIG. 1B is a diagram showing a resonant frequency shift of the driven modes of an exemplary phononic frequency comb sensing scheme in accordance with various embodiments of the present disclosure.
Figure 1C:
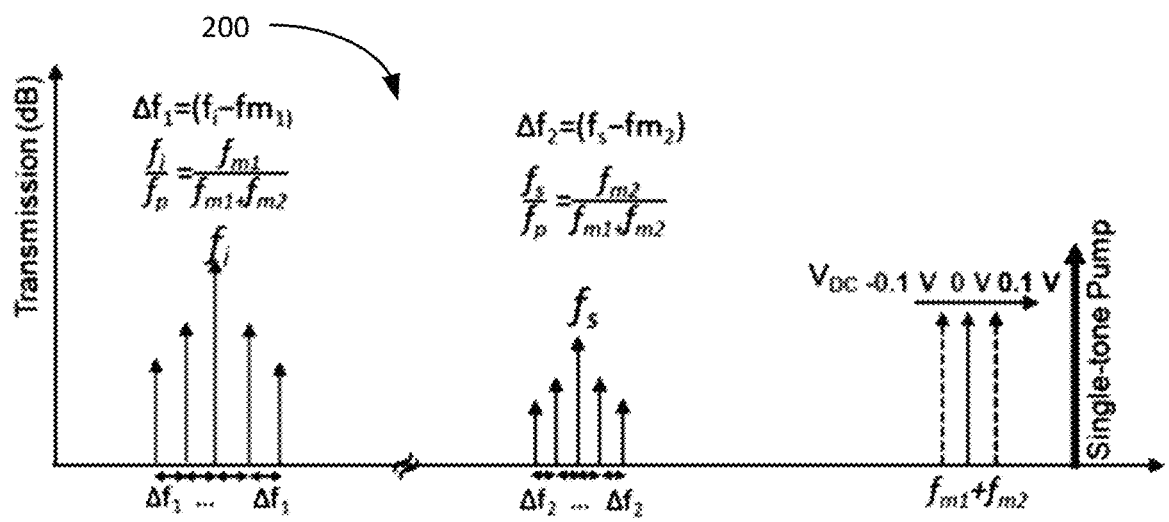
FIG. 1C is a diagram showing the creation of phononic frequency combs close to two mechanical modes of an exemplary phononic frequency comb sensing scheme in accordance with various embodiments of the present disclosure.

Referring now to the figures, FIG. 1B and FIG. 1C show an exemplary novel phononic frequency comb scheme in accordance with various embodiments of the present disclosure. In FIG. 1B, a resonant frequency shift of the driven modes of an embodiment of phononic frequency combs is presented. The resonant frequency shifts are due to a change in the effective mass or stiffness of the mechanical resonator. An applied DC voltage changes the stiffness of the mechanical resonator with different sensitivities at mode 1 and 2. In this example, the DC voltage is varied from −0.1 V to 0.1 V in 0.1 V steps and sensitivities of 0.015/V and 0.022/V are observed for the two resonance modes. Next, in FIG. 1C, the creation of frequency combs 200 close to two mechanical modes of the mechanical resonator is depicted for an exemplary embodiment of the present disclosure. As the DC voltage changes the stress, the detuning frequency between the pump 110 and the sum of the two mechanical modes change. Here, the two mechanical modes undergo different frequency shifts as the stiffness of a circular membrane of a mechanical resonator, in one embodiment, is modulated by DC voltage (from −0.1 V to 0.1 V with 0.1 V steps). The shift in the mechanical modes cause a shift in the detuned frequency and thus a change in the frequency spacing of the frequency comb 200.

In one embodiment, the frequency spacing between spectral lines are generated based on four-wave mixing between two resonance modes and pump frequency. Further, the center frequency and frequency spacing can be adjusted by tuning the frequency and the power (amplitude) of pump tone. Moreover, the frequencies of two mechanical modes can be tuned by application of a DC voltage and modulation of piezoelectrically-induced stress (thin film stress).

Figure 2A:
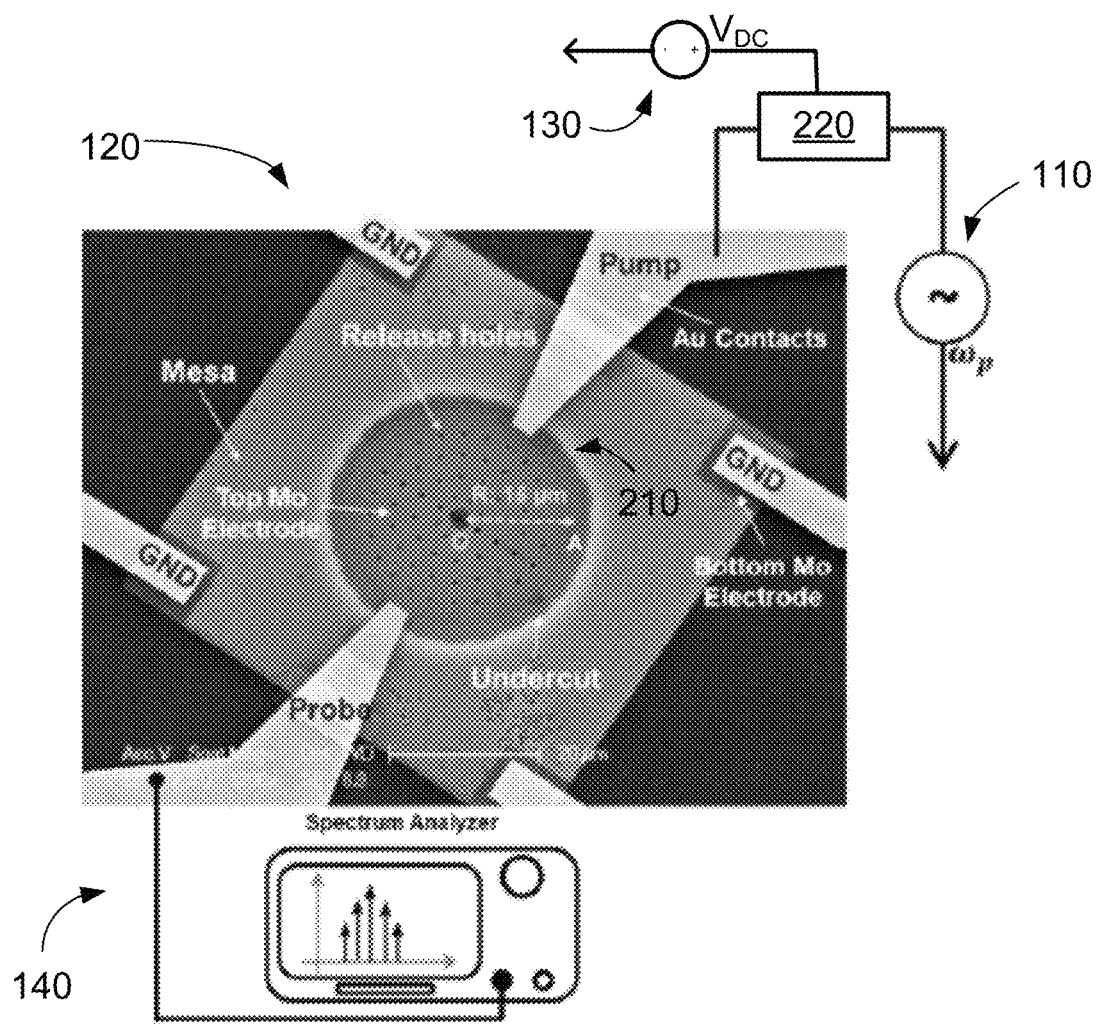
FIG. 2A is a scanning electronic micrograph (SEM) image of an AlN-on-Si mechanical resonator for an exemplary phononic frequency comb sensor in accordance with various embodiments of the present disclosure.

Referring now to FIG. 2A, the figure shows a scanning electron micrograph (SEM) image of an embodiment of a circular membrane 210 of the mechanical resonator 120 (e.g., a piezoelectric circular drumhead resonator). In particular, a measurement setup for frequency comb generation is depicted utilizing a fabricated AlN-on-Si circular membrane surrounded by a mesa structure, where Aluminum Nitride (AlN) is a piezoelectric material. A single tone pump 110 drives the mechanical resonator 120 and the output probe 140 (e.g., via a spectrum analyzer) probes the motion of the resonator to generate an output signal having a frequency comb pattern. In this exemplary embodiment, the radius of the circular membrane is, but not limited to, 15 µm. The mechanical resonator structure also includes gold contacts, release holes in the circular membrane 210 for isotopically etching a buried oxide layer with hydrofluoric acid (HF), and top and bottom electrodes comprising molybdenum (Mo). In certain embodiments, a bias-T circuit component 220 may also be used to couple a DC voltage 130 to the mechanical resonator 120 (which can induce thin film stress and shift a resonance frequency of the resonator 120).

Figure 2B:
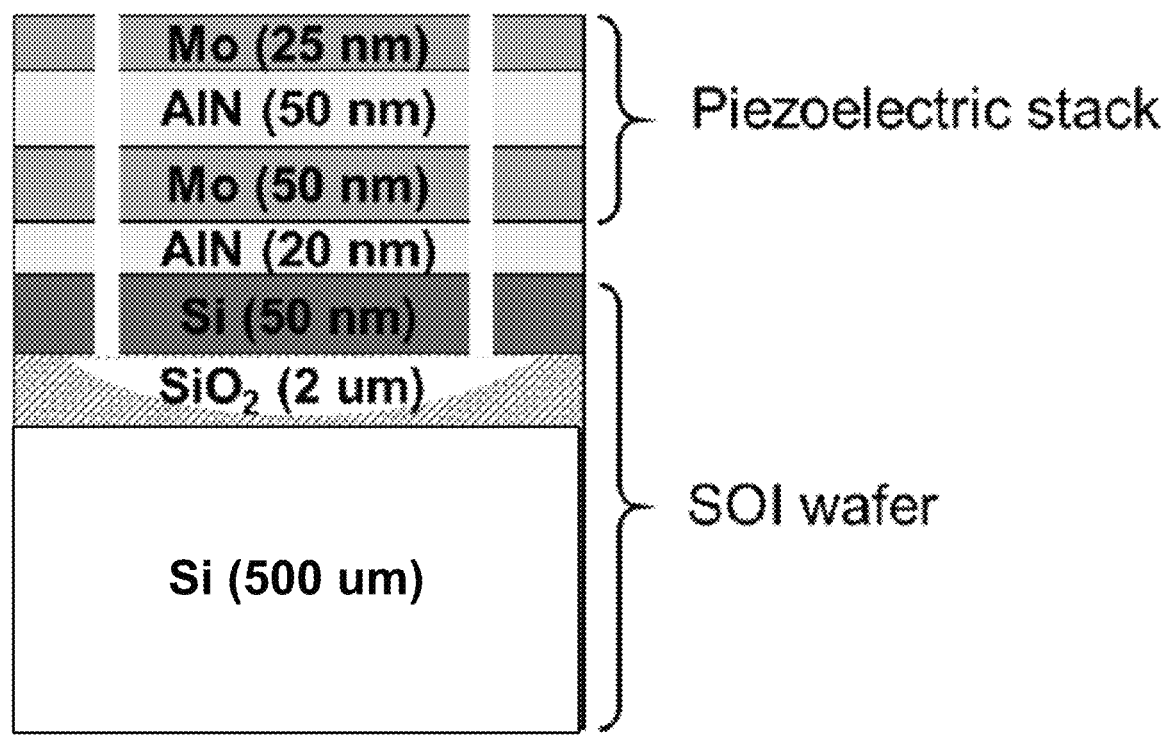
FIG. 2B is a diagram showing a cross section view of the AlN-on-Si mechanical resonator of FIG. 2A.

Correspondingly, FIG. 2B demonstrates an exemplary cross section of the resonant stack for the mechanical resonator 120 (of FIG. 2A) with a total of <200 nm thickness for various embodiments. Such a thin membrane helps achieve nonlinear behavior at lower power levels. As shown in the figure, an embodiment of such a thin membrane includes a piezoelectric stack having layers of Mo (25 nm), AlN (50 nm), and Mo (50 nm) on a Silicon on Insulin wafer having layers of AlN (20 nm), Si (50 nm), SiO$_2$ (2 µm), and Si (500 µm). When the multimode mechanical resonator 120 is pumped with a single tone at a frequency close to the sum of two mechanical modes ($f_{m1}+f_{m2}$), a frequency comb 200 is generated close to each of the mechanical modes having a set of equally-distanced phase-coherent spectral lines.

In one exemplary embodiment, a generated frequency comb 200 has a center frequency of 3.548 MHz with a frequency spacing of 404 Hz. However, the center frequency and frequency spacing of the comb can be adjusted by tuning the pump frequency and amplitude. Furthermore, due to the mechanical mode frequencies being very sensitive to DC voltage, the modes can be tuned by static piezoelectric stress (thin film stress). For example, with respect to FIGS. 2A and 2B, the large nonlinearity present in the stiffness of thin AlN films causes the amplitude of one resonance mode to shift the resonance frequency of another mode. The thin film stress-induced coupling between the two mechanical modes is determined by the displacement amplitude, dissipation rate, resonance frequency and mode shapes of each mode induced by the piezoelectric excitation. Therefore, by taking advantage of the mode coupling between two modes in the same acoustic cavity of the mechanical resonator 120, the size of the frequency comb can be made minimal. To illustrate, one embodiment of a piezoelectric frequency comb in accordance with the present disclosure only has a 30 µm×30 µm footprint and features a linear center frequency tuning capability by pump frequency.

Figure 3A:
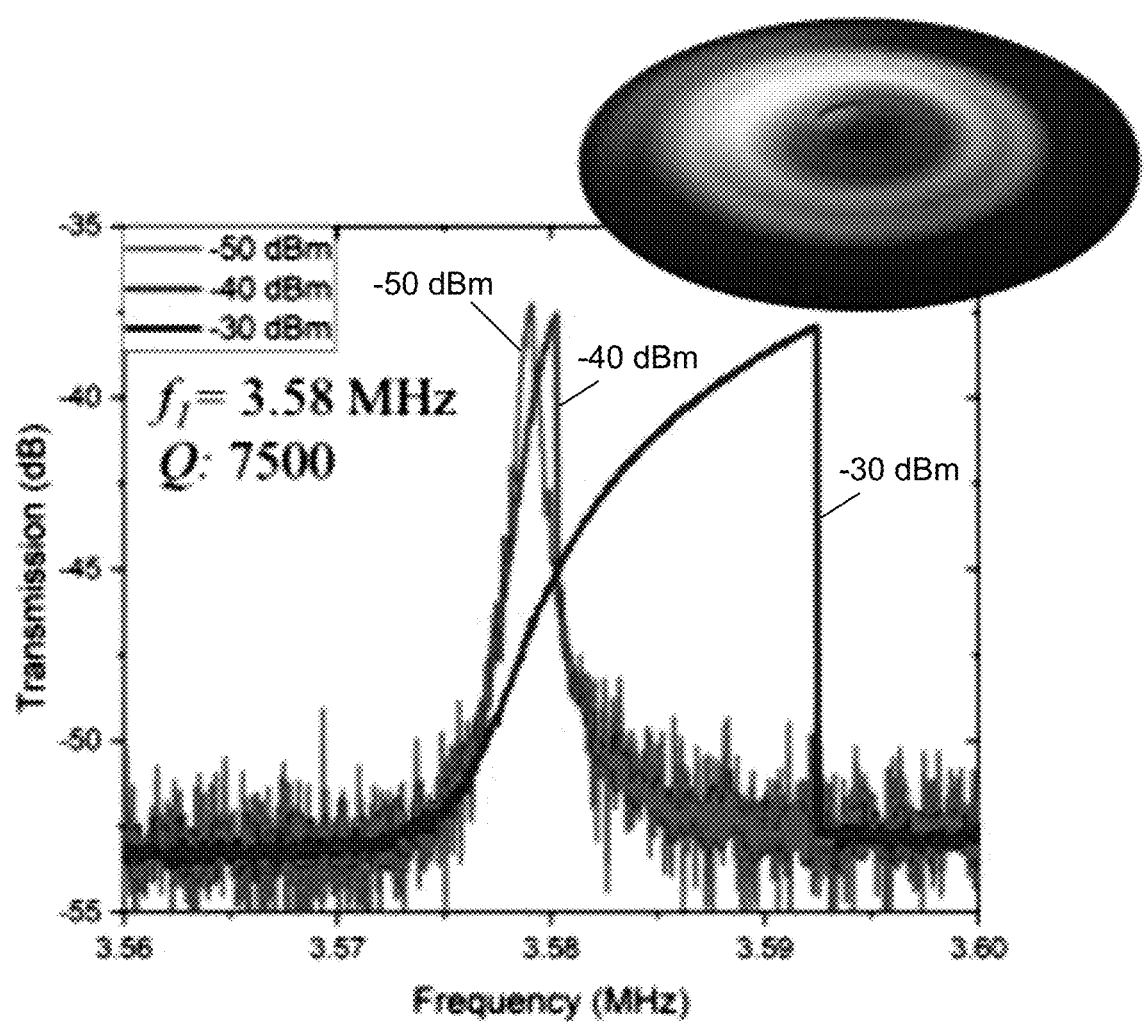
FIG. 3A is a diagram of a driven resonance mode along with displace mode shape at different input power levels for a first mechanical mode (mode 1) of an exemplary mechanical resonator of a phononic frequency comb sensor in accordance with various embodiments of the present disclosure.
Figure 3B:
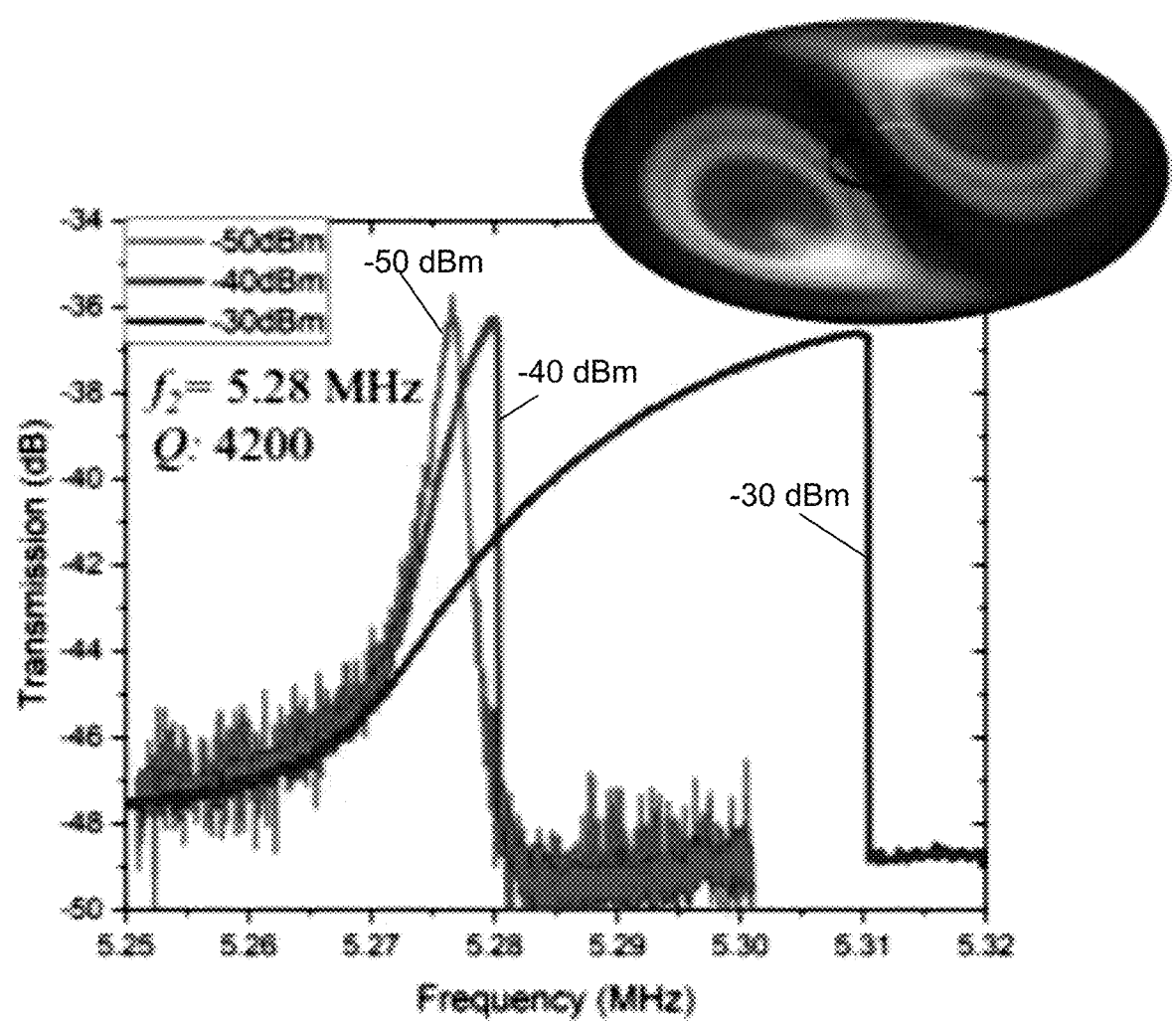
FIG. 3B is a diagram of a driven resonance mode along with displace mode shape at different input power levels for a second mechanical mode (mode 2) of an exemplary mechanical resonator of a phononic frequency comb sensor in accordance with various embodiments of the present disclosure.

Further details of embodiments of the phononic frequency comb are provided in the following figures and accompanying descriptions. Accordingly, FIGS. 3A and 3B show the driven resonance modes of the two acoustic resonance modes of the mechanical resonator 120 at different input power levels, demonstrating the Duffing nonlinearity. The governing harmonic oscillator equations that include the two coupled modes are:

$$\ddot{x}_1 + \omega_1^2 x_1 + (\omega_1/Q_1)\dot{x}_1 + (\gamma_{12}/m_1)x_1 x_2^2 + (\alpha_1/m_1)x_1^3 = \quad (1)$$
$$(F/m_1)x_2 \cos \omega_p t$$

$$\ddot{x}_2 + \omega_2^2 x_2 + (\omega_2/Q_2)\dot{x}_1 + (\gamma_{21}/m_2)x_2 x_1^2 + (\alpha_2/m_2)x_2^3 = \quad (2)$$
$$(F/m_2)x_1 \cos \omega_p t$$

where $x_{1,2}$ are the mode displacements, $Q_{1,2}$ are the Q factors, $m_{1,2}$ are the effective masses, $\omega_{1,2}$ are the Duffing nonlinearity coefficients for mode 1 and 2 respectively, $\gamma_{12}$ denotes the dispersive coupling between mode 1 and 2; $\omega_p$ is the pump frequency; and F is the amplitude of the pump 110.

Figure 4:
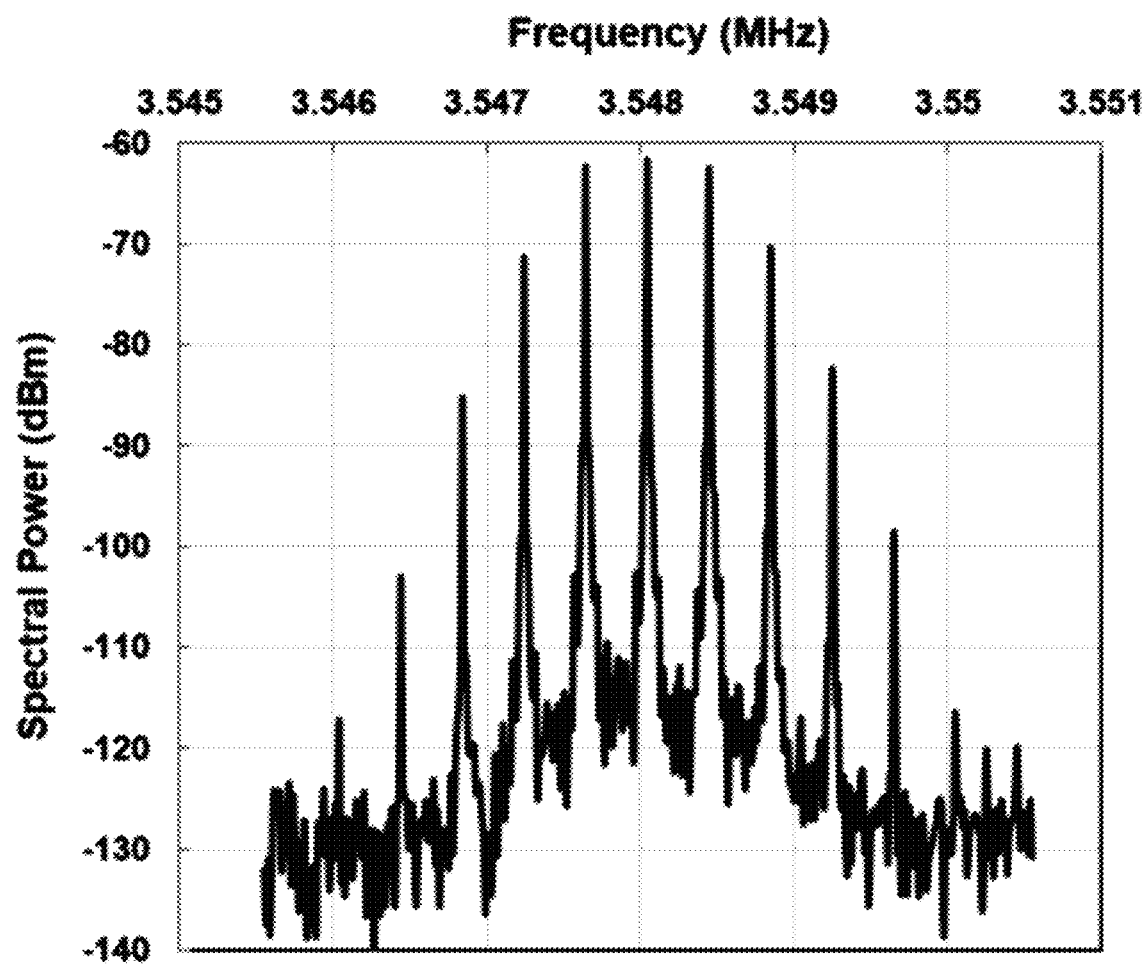
FIG. 4 is a diagram showing an exemplary phononic frequency comb spectrum centered at an idler frequency with spacing determined by the detuning of the pump from the sum of mechanical modes.
Figure 5:
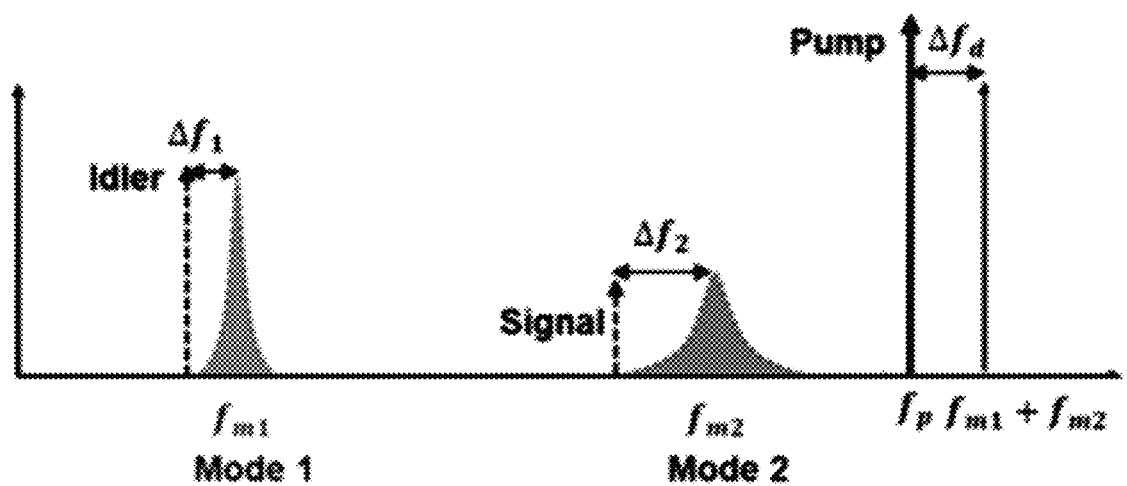
FIG. 5 is a diagram illustrating a a single tone that can be applied to excite the signal and idler mode with a frequency offset for a phononic frequency comb sensor in accordance with various embodiments of the present disclosure.

Next, FIG. 4 presents an exemplary phononic frequency comb spectrum centered at the idler frequency (3.548 MHZ) with spacing determined by the detuning of the pump 110 from the sum of the frequencies for the mechanical modes. Here, a shift in frequency spacing, due to an applied DC voltage 130, shifts the frequencies for the two mechanical modes. As demonstrated in FIG. 5, a single tone at $f_p$, detuned from $f_{m1}+f_{m2}$, can be applied to excite the signal and idler mode with a frequency offset of $\Delta f_1$ and $\Delta f_2$, where $f_{m1}$ and $f_{m2}$ correspond to the $u_{01}$ and $u_{11}$ modes (first mechanical mode and the second mechanical mode) shown in FIG. 3A and FIG. 3B. The single tone at $f_p$ (i. e., $\omega_p/2\pi$) induces a signal and idler distanced by $\Delta f_1$ and $\Delta f_2$ from $f_{m1}$ and $f_{m2}$ respectively.

Figure 6A:
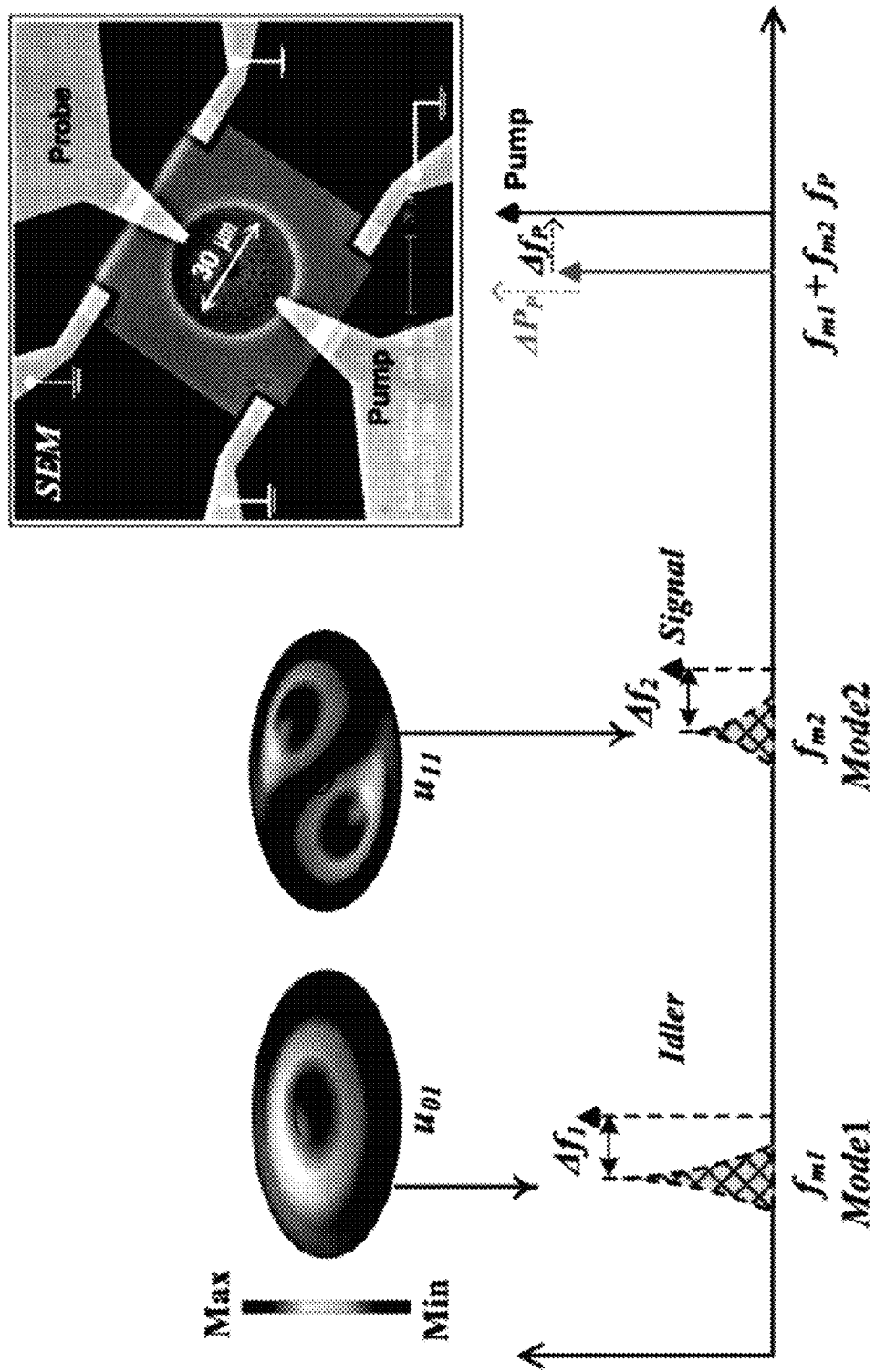
FIG. 6A shows the device geometry and displacement mode shapes of two mechanical resonance modes of an exemplary mechanical resonator of a phononic frequency comb sensor in accordance with various embodiments of the present disclosure.
Figure 6B:
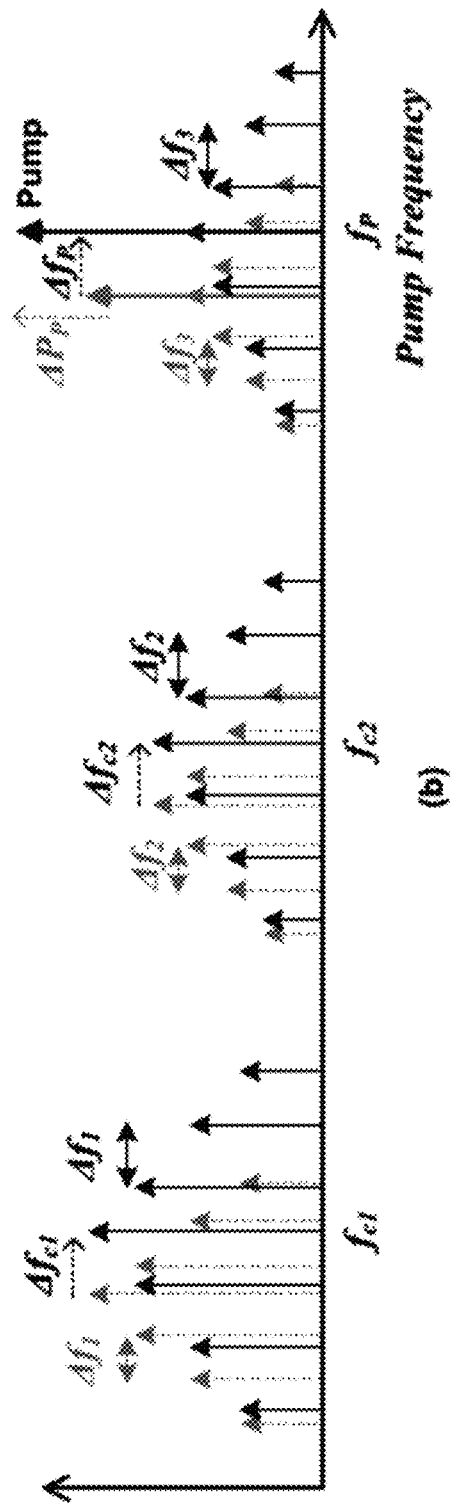
FIG. 6B shows an exemplary comb measurement scheme highlighting the tuning of center frequencies and frequency spacings of two sets of frequency combs located close to the mechanical resonance modes of an exemplary mechanical resonator of a phononic frequency comb sensor by detuning the pump frequency and power in accordance with various embodiments of the present disclosure.
Figure 6C:
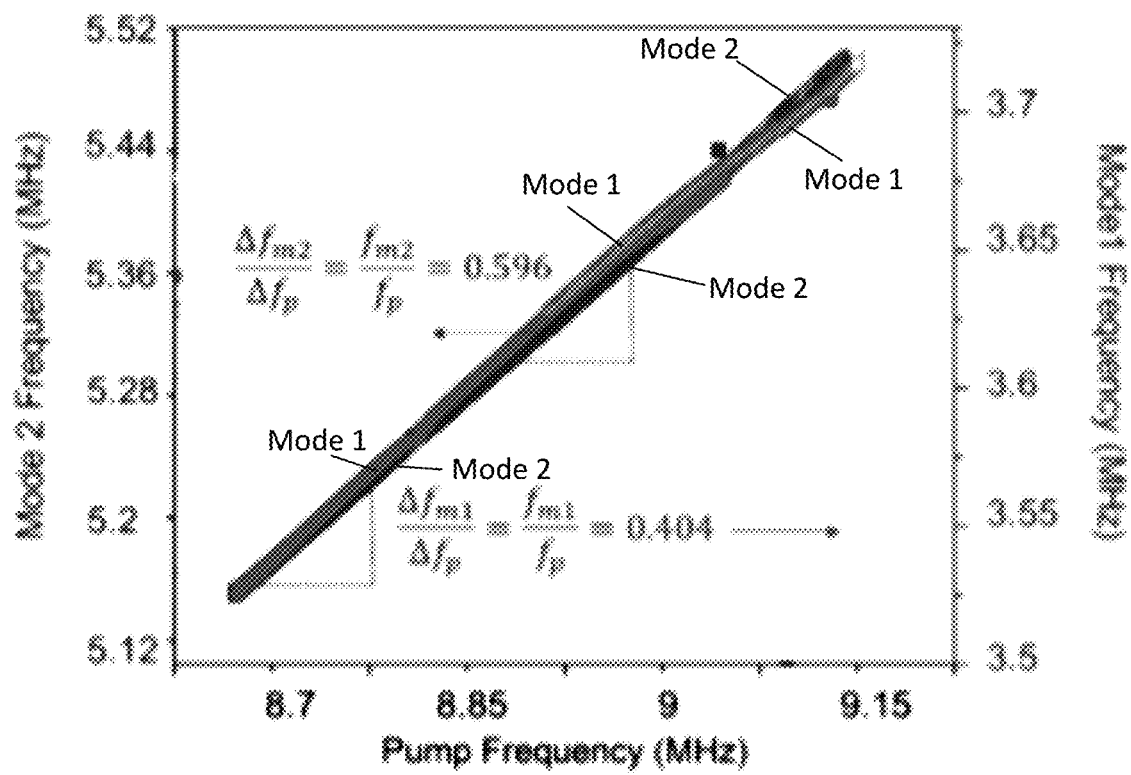
FIG. 6C provides a plot of the frequency of signal and idler as the pump frequency is swept for an exemplary phononic frequency comb in accordance with embodiments of the present disclosure.
Figure 6D:
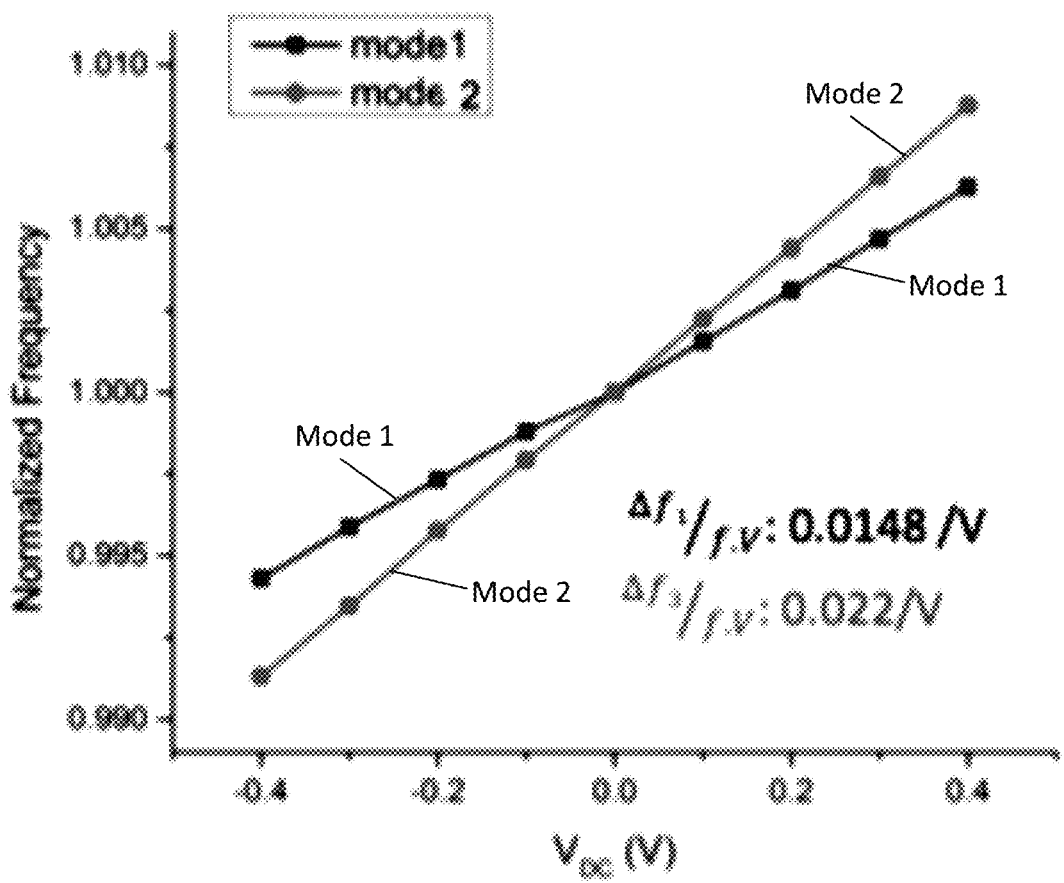
FIG. 6D is a plot of the frequency of signal and idler as static stress induced by DC voltage is swept for an exemplary phononic frequency comb in accordance with embodiments of the present disclosure.
Figure 7:
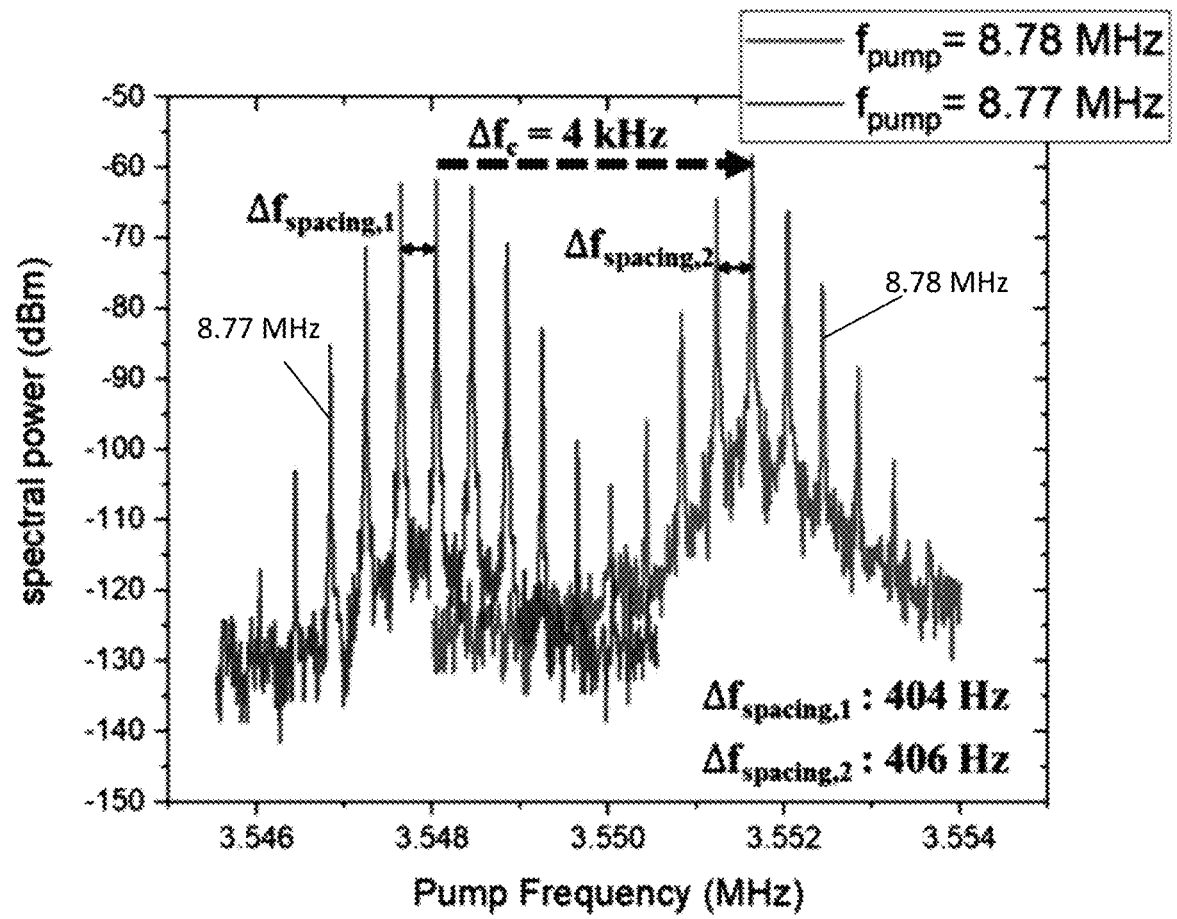
FIG. 7 is a plot demonstrating the frequency tuning of the two mechanical modes versus DC voltage for an exemplary phononic frequency comb in accordance with embodiments of the present disclosure.

In FIG. 6A, the comb generation using non-degenerate parametric pump frequency at the sum of the two mechanical modes, corresponding to $u_{01}$ and $u_{11}$ is depicted. Here, the sets of combs are observed with two sets being placed close to the signal/idler frequency and one centered at the pump frequency. On the top right of the figure, a SEM image of a standalone AlN-on-Si micromechanical resonator is shown. For FIG. 6B, by tuning the pump amplitude and frequency, the figure illustrates that the center frequency of combs and $\Delta f_p$ can be detuned. At FIG. 6C, the signal and idler frequencies are plotted as the pump frequency is swept showing a linear trend. In addition, the plot shows that tuning the center frequency of the phononic comb is possible by tuning the pump frequency. Furthermore, the mechanical resonance modes can be tuned by static piezoelectric stress induced by DC voltage at clamped boundaries of the mechanical resonator 120, as shown by FIG. 6D. For example, FIG. 7 demonstrates the frequency tuning of the two mechanical modes versus DC voltage for an exemplary embodiment. It is observed in this example that the frequency spacing is 404 Hz at a pump frequency of 8.77 MHz, where the input pump power was maintained at 30 dBm.

In FIGS. 8A-8D, four different dynamic states of parametric excitation close to mechanical resonance modes of a drumhead circular MEM resonator are investigated. In particular, FIGS. 8A-8D depict the continuous sequel of parametric excitation in a strongly driven nonlinear MEM resonator. At a constant pump power of 7 dBm, the pump frequency is swept with 2 kHz steps, starting at 8.828 MHz, where no signal/idler tone is observed. The spectrum evolves into formation of a single tone (signal/idler), combs, and chaotic behavior. Accordingly, different dynamical regimes depicting the sequential evolution of the power spectrum as the parametric pump frequency increases from FIG. 8A to FIG. 8D are provided. The four different dynamic states are described below.

Figure 8A:
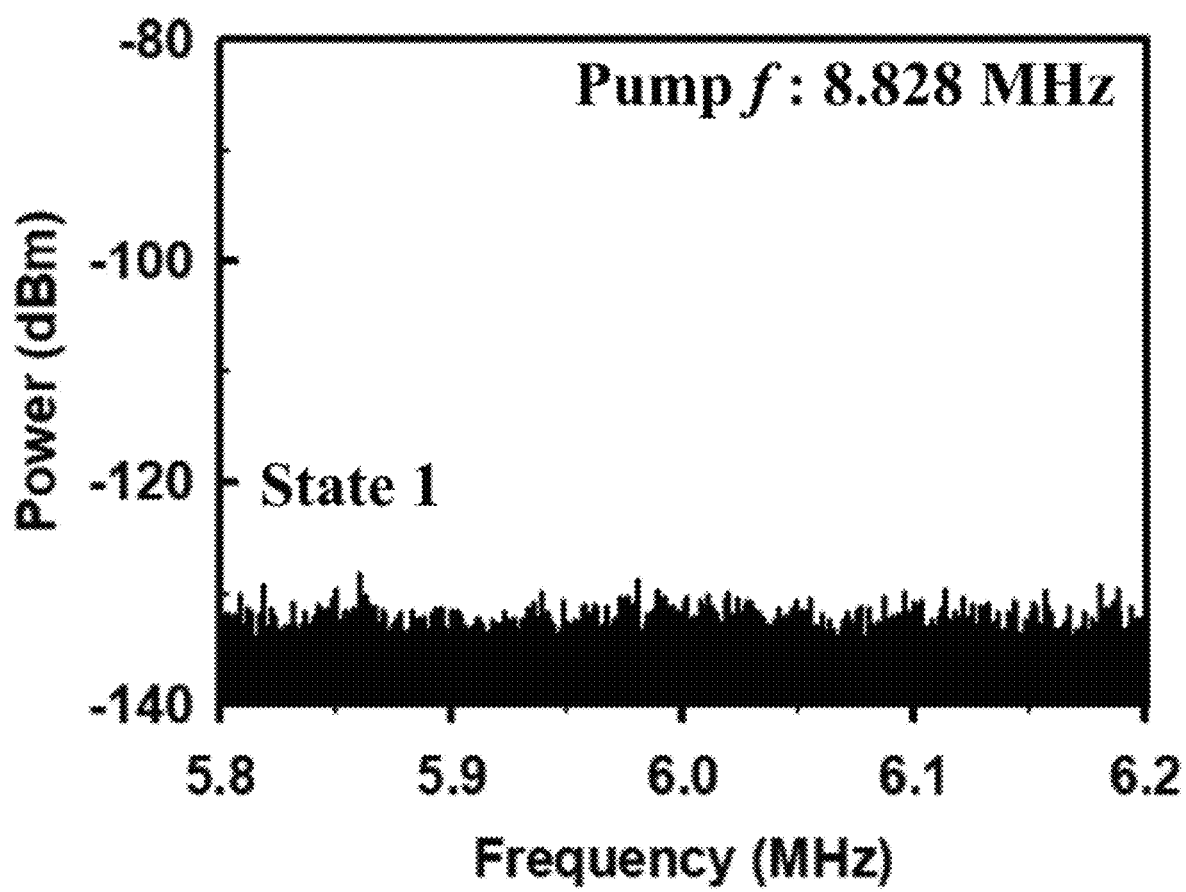
FIGS. 8A-8D show different dynamical regimes depicting the sequential evolution of the power spectrum as the parametric pump frequency increases for an exemplary phononic frequency comb in accordance with various embodiments of the present disclosure.
Figure 8B:
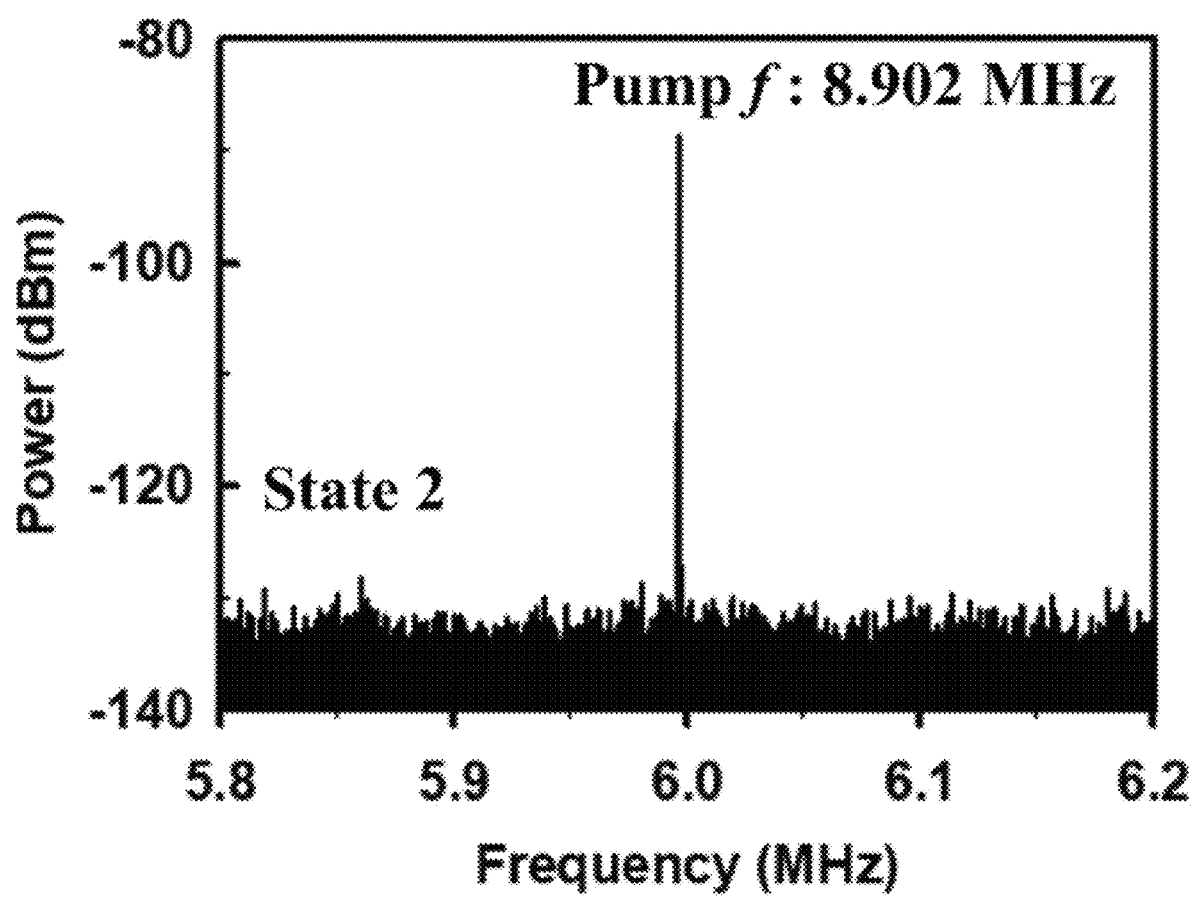
Figure 8C:
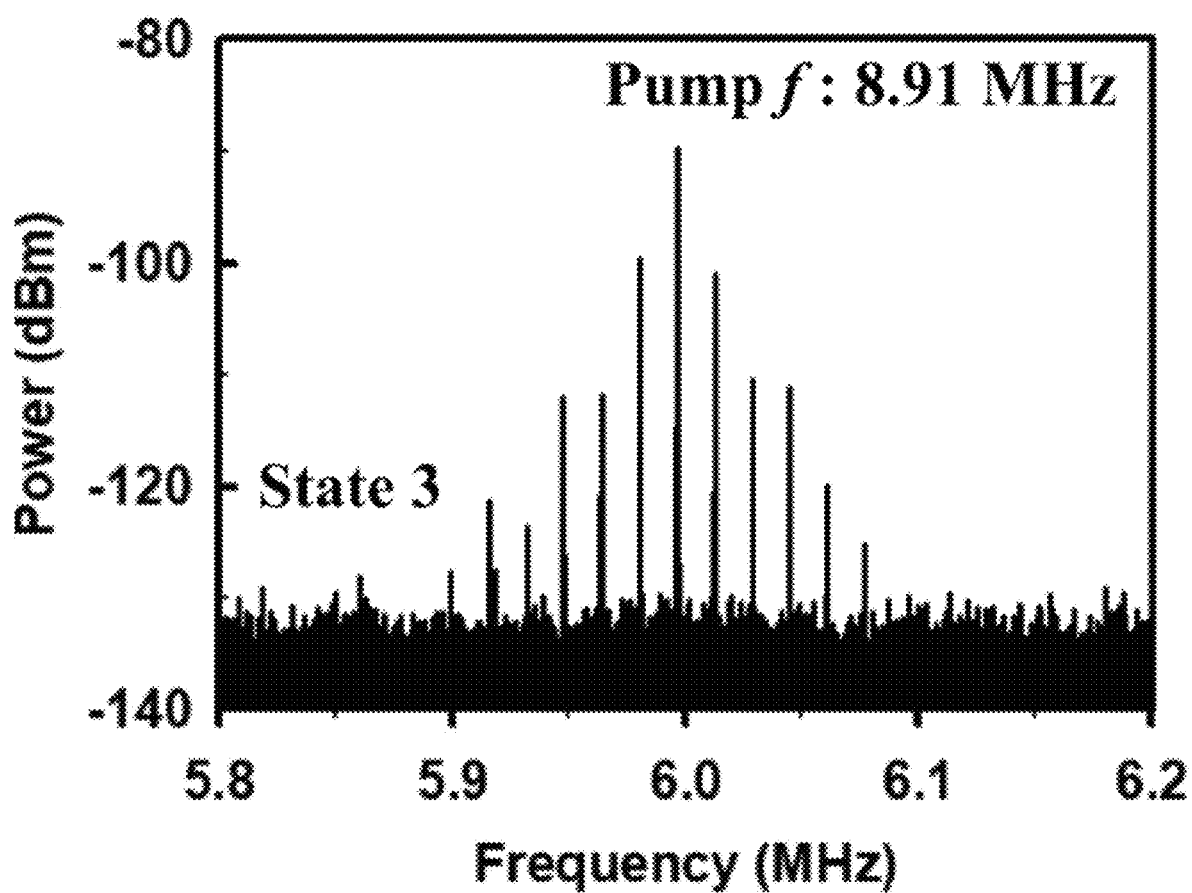
Figure 8D:
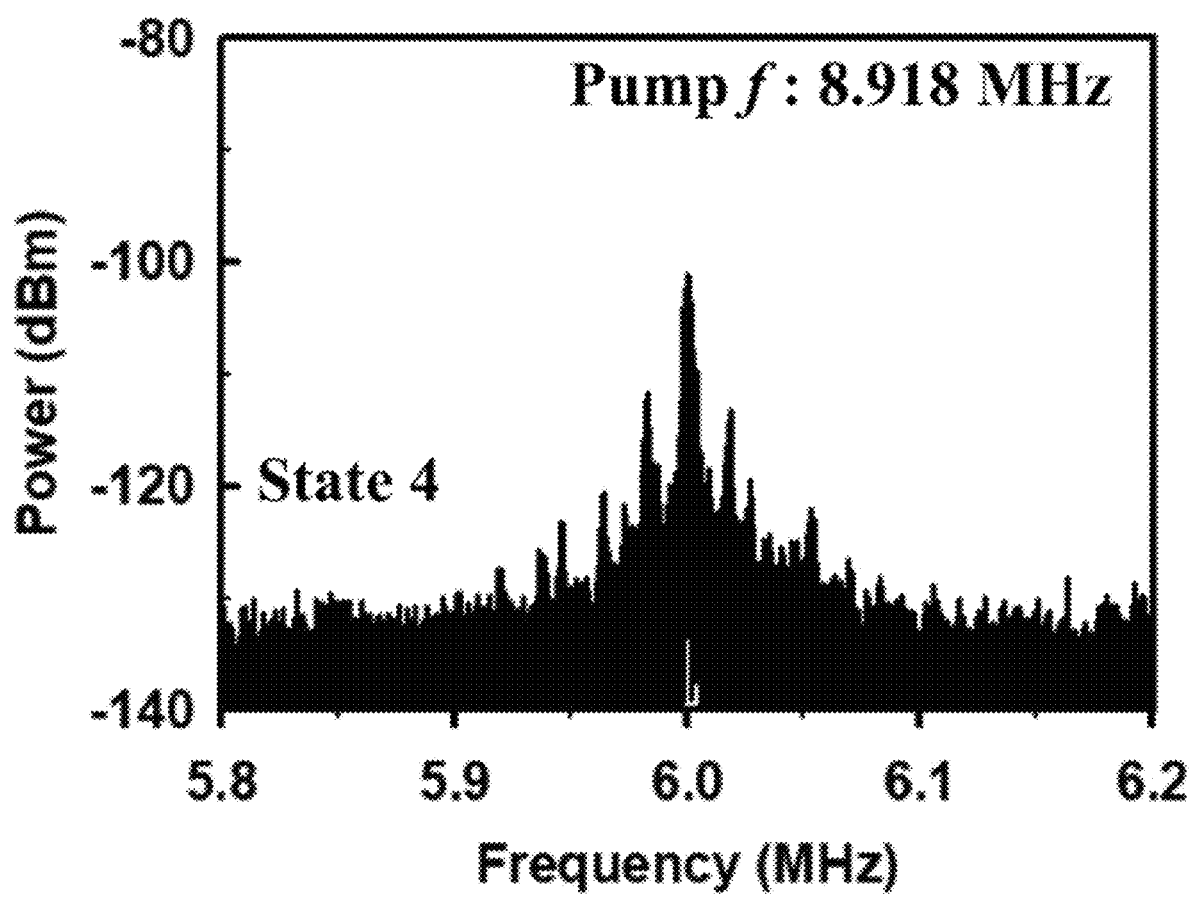

For State 1, there is no parametric excitation and marks the beginning and end of the evolution sequence, as shown in FIG. 8A. For State 2, a single tone is generated close to un resonance mode of the circular membrane, as shown in FIG. 8B. This state exists at pump frequencies ranging from 8.83 MHz to 8.902 MHz. For State 3, the tone breaks down into several equidistanced spectral lines (frequency combs), as shown in FIG. 8C, with the pump frequency ranging from 8.904 MHz to 8.916 MHZ, resembling the spectrum of temporal solitary waves in optomechanical systems. For State 4, a triangular-envelope spectrum persists for a frequency range of 106 kHz bandwidth from 8.918 MHz to 9.024 MHz, as shown in FIG. 8D.

In an alternative embodiment, instead of non-degenerate parametric pumping, degenerate parametric pumping may be used such that frequency combs can be achieved with a single resonance mode, when the pump frequency is twice the frequency of the resonance mode. As a result, a set of frequency combs can be achieved with a center frequency close to the resonance mode of the resonator.

In summary, instead of using external coupling mechanisms of two or more resonators, as demonstrated by earlier techniques, embodiments of the present disclosure take advantage of piezoelectric stress-induced mode coupling within the same acoustic cavity of a multimode mechanical resonator 120. Certain embodiments of a phononic frequency comb 200 in accordance with the present disclosure utilizes non-degenerate parametric pumping to induce a signal and idler mode close to two mechanical modes of a mechanical resonator 120 and uses frequency mixing and subharmonic excitation inherent to the nonlinear behavior of the mechanical resonator 120 to generate multiple spectral lines (e.g., with a frequency spacing of ~404 Hz), which provides several advantages over earlier techniques. For example, an advantage over degenerate parametric excitation lies in the fact that the two mechanical modes can be arbitrarily designed and chosen, wherein the added degree of freedom allow for accurate control over the frequency spacing between the spectral lines and the center frequency. Moreover, phononic frequency combs of the present disclosure have applications, among others, as highly sensitive dual-mode sensors, self-sustained micromechanical sensors, and/or frequency synthesizers that can be optimized to cancel out environmental drifts with enhanced "beat frequency," while taking advantage of its simplified design and small size.

Another advantage is the phase coherence of the spectral lines of phonic frequency combs of various embodiments of the present disclosure. For example, the generated side bands (at the sum of two mechanical modes ($f_{m1}+f_{m2}$)) have a defined phase relationship with respect to the pump phase. In contrast, for many conventional phononic techniques, the frequency-shift detection is often not limited by the resonator Q, but instead bound to some anomalous temperature-dependent frequency/phase fluctuations. Additionally, oscillator circuits traditionally have phase freedom, while their amplitude arc is limited by a limiting amplifier or a nonlinearities in the system. Thus, using a phase coherent detection mechanism along with two-mode compensation techniques, in accordance with the present disclosure, will yield higher phase stability as compared to traditional amplitude-saturated oscillator circuits. Accordingly, embodiments of the phononic frequency comb of the present disclosure can replace traditional MEMS-CMOS integrated configuration as the building block of oscillators, which can decrease the footprint and the noise (e.g., shot noise) associated with electronic circuitry. For example, by taking advantage of two resonance modes within the same acoustic cavity, the electronic design can be significantly simplified.

To illustrate, an exemplary phononic frequency comb of the present disclosure, is in principle, analogous to the optical micro-resonator frequency combs which are widely used in frequency synthesizers and dual-mode sensing applications. However, unlike the optical frequency comb counterparts, an exemplary phononic frequency comb is fully-integrated, with voltage input and output, does not require coupling of light to a micro-resonator and relies on optimizing the design of a single acoustic cavity instead of optical and acoustic cavity optimization.

While traditional techniques utilize an energy restoring element that compensates for the losses in the mechanical resonator in a feedback loop, an exemplary embodiment of a phononic frequency comb of the present disclosure does not require such an energy restoring element by utilizing a single tone pump 110 with a frequency equal to the sum of the frequencies of two acoustic modes within a single mechanical resonator 120. Accordingly, embodiments of the present disclosure are well-suited for many applications, such as synthesizing a range of frequencies based on the at least one phononic frequency comb. Other applications also include detecting perturbations in the environment (e.g., a change in temperature or mass associated with the mechanical resonator), since resonant frequency-shift detection has proven to be a highly accurate sensing method.

Figure 9:
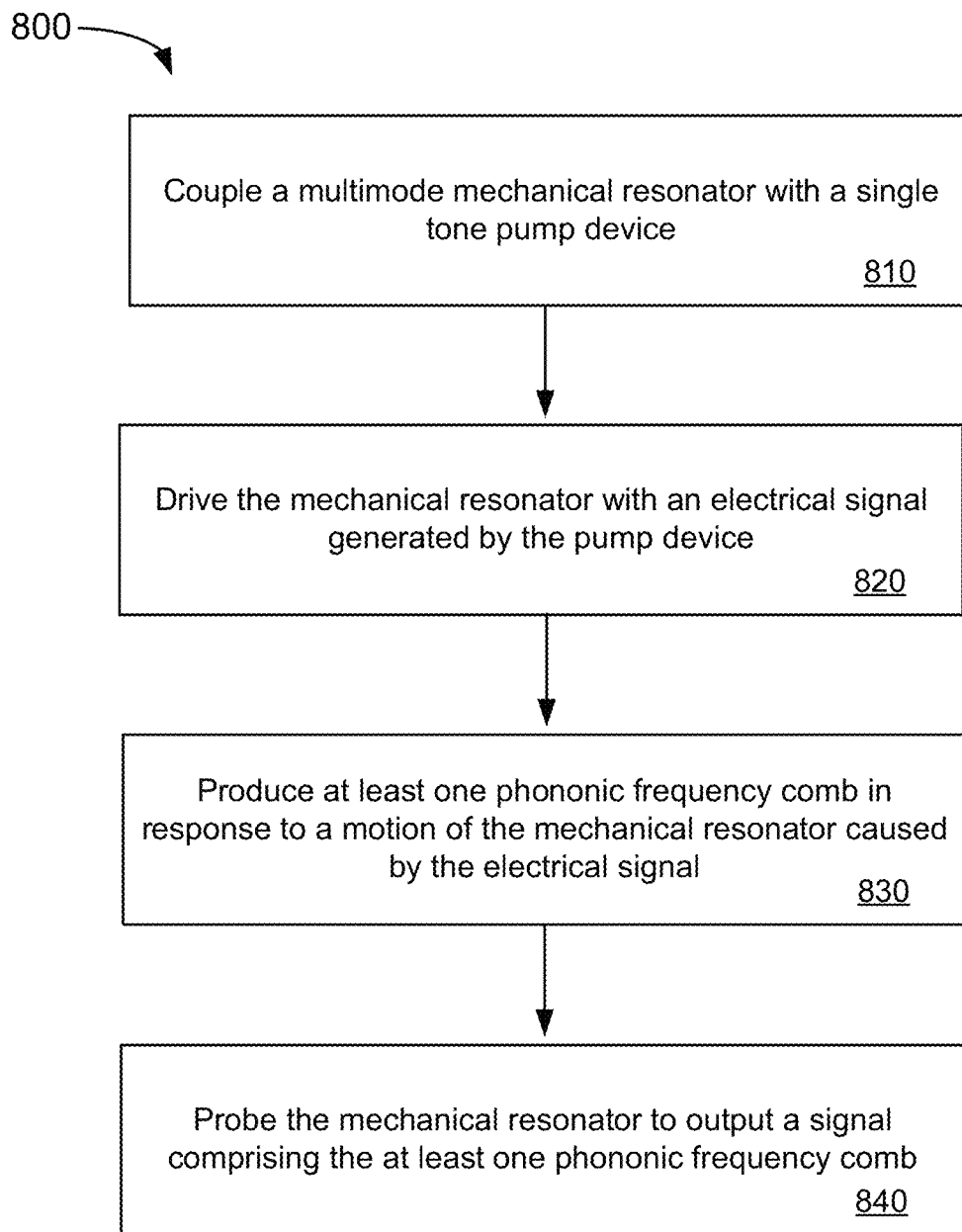
FIG. 9 is a flow chart diagram illustrating an exemplary phonic frequency comb method in accordance with various embodiments of the present disclosure.

Referring to FIG. 9, shown is a flow chart 800 illustrating an exemplary phonic frequency comb method in accordance with embodiments of the present disclosure. Beginning with 810, a multimode mechanical resonator 120 is coupled with a single tone pump device 110. Next, the mechanical resonator 120 is driven with an electrical signal generated (820) by the pump device 110 in which the electrical signal has a pump amplitude and a single pump frequency, wherein a value of the pump frequency equals a sum of the resonance frequencies of two acoustic or mechanical resonance modes of the mechanical resonator 120. In response to a motion of the mechanical resonator 120 caused by the electrical signal, at least one phononic frequency comb is produced (830). Therefore, the mechanical resonator 120 can be probed (840) to extract an output signal from an electrode of the mechanical resonator 120, where the signal comprises the at least one phononic frequency comb. In various embodiments, additional operations may include adjusting a frequency spacing of the phononic frequency comb based on the electrical signal of the pump device and/or tuning the resonance modes of the mechanical resonator by applying a DC voltage to a clamped boundary of the mechanical resonator, among others.

It should be emphasized that the above-described embodiments of the present disclosure are merely possible examples of implementations, merely set forth for a clear understanding of the principles of the disclosure. Many variations and modifications may be made to the above-described embodiment(s) without departing substantially from the principles of the present disclosure. All such modifications and variations are intended to be included herein within the scope of this disclosure and the following claims.

The invention claimed is:

1. A method comprising:
   driving a piezoelectric mechanical resonator with an electrical AC signal, wherein the electrical AC signal causes motion of the piezoelectric mechanical resonator; and
   producing at least one phononic frequency comb in response to the motion of the piezoelectric mechanical resonator.

2. The method of claim 1, wherein the at least one phononic frequency comb comprises a plurality of phononic frequency combs.

3. The method of claim 2, wherein multiple phononic frequency combs occur close to mechanical resonance frequencies of the excited modes, when the electrical AC signal is applied.

4. The method of claim 3, wherein a first of the three phononic frequency combs occurs at a first mechanical resonance mode of the piezoelectric mechanical resonator, a second of the three phononic frequency combs occurs at a second mechanical resonance mode of the piezoelectric mechanical resonator, and a third of the three phononic frequency combs occurs at a pump frequency of the electrical AC signal.

5. The method of claim 4, wherein each of the three phononic frequency combs has equally-distanced phase-coherent spectral lines.

6. The method of claim 1, wherein the electrical AC signal comprises a single frequency electrical input.

7. The method of claim 1, wherein the piezoelectric mechanical resonator has two mechanical resonance modes, wherein the electrical AC signal comprises a single frequency electrical input, wherein a single frequency of the electrical AC signal is equal to a sum of frequencies of the two mechanical resonance modes.

8. The method of claim 1, wherein the piezoelectric mechanical resonator has a single mechanical resonance mode excited, wherein the electrical AC signal comprises a single frequency electrical input, wherein a single frequency of the electrical AC signal is equal to twice or half of the frequency of the mechanical resonance mode.

9. The method of claim 1, further comprising shifting a frequency spacing of a mechanical resonance mode of the piezoelectric mechanical resonator by applying a DC voltage signal to the piezoelectric mechanical resonator.

10. The method of claim 1, further comprising sensing an environmental change by tracking frequency spacing between spectral lines of the at least one phononic frequency comb.

11. A system comprising:
    a piezoelectric mechanical resonator;
    an electrical AC signal input that is configured to drive the piezoelectric mechanical resonator and produce a motion of the piezoelectric mechanical resonator; and
    an output probe coupled to the piezoelectric mechanical resonator, wherein the output probe is configured to output at least one phononic frequency comb in response to the motion of the piezoelectric mechanical resonator.

12. The system of claim 11, wherein the at least one phononic frequency comb comprises a plurality of phononic frequency combs.

13. The system of claim 12, wherein multiple phononic frequency combs occur close to mechanical resonance frequencies of the excited modes, when an electrical AC signal is applied.

14. The system of claim 13, wherein a first of the three phononic frequency combs occurs at a first mechanical resonance mode of the piezoelectric mechanical resonator, a second of the three phononic frequency combs occurs at a second mechanical resonance mode of the piezoelectric mechanical resonator, and a third of the three phononic frequency combs occurs at a pump frequency of the electrical AC signal input.

15. The system of claim 14, wherein each of the three phononic frequency combs has equally-distanced phase-coherent spectral lines.

16. The system of claim 11, wherein the electrical AC signal input comprises a single frequency electrical input.

17. The system of claim 11, wherein the piezoelectric mechanical resonator has two mechanical resonance modes, wherein the electrical AC signal input comprises a single frequency electrical input, wherein a single frequency of the electrical AC signal input is equal to a sum of frequencies of the two mechanical resonance modes.

18. The system of claim 11, wherein the piezoelectric mechanical resonator has a single mechanical resonance mode excited, wherein the electrical AC signal input comprises a single frequency electrical input, wherein a single frequency of the electrical AC signal input is equal to twice or half of the frequency of the mechanical resonance mode.

19. The system of claim 11, further comprising a DC voltage input coupled to the piezoelectric mechanical resonator, wherein the DC voltage input is configured to shift a frequency spacing of a mechanical resonance mode of the piezoelectric mechanical resonator by applying a DC voltage signal to the piezoelectric mechanical resonator.

20. A micromechanical sensor comprising the system of claim 11, wherein the micromechanical sensor is configured to sense an environmental change by tracking frequency spacing between spectral lines of the at least one phononic frequency comb.

\* \* \* \* \*